US009911905B2

(12) United States Patent
Richter

(10) Patent No.: US 9,911,905 B2
(45) Date of Patent: Mar. 6, 2018

(54) METHOD OF PRODUCING AN OPTOELECTRONIC COMPONENT

(71) Applicant: OSRAM Opto Semiconductors GmbH, Regensburg (DE)

(72) Inventor: Markus Richter, Burglengenfeld (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/888,528

(22) PCT Filed: Apr. 28, 2014

(86) PCT No.: PCT/EP2014/058612
§ 371 (c)(1),
(2) Date: Nov. 2, 2015

(87) PCT Pub. No.: WO2014/180697
PCT Pub. Date: Nov. 13, 2014

(65) Prior Publication Data
US 2016/0056346 A1    Feb. 25, 2016

(30) Foreign Application Priority Data
May 6, 2013    (DE) .................. 10 2013 208 223

(51) Int. Cl.
*H01L 33/50*    (2010.01)
*H01L 33/44*    (2010.01)

(52) U.S. Cl.
CPC .............. *H01L 33/50* (2013.01); *H01L 33/44* (2013.01); *H01L 2224/48091* (2013.01);
(Continued)

(58) Field of Classification Search
CPC ... H01L 33/50; H01L 33/44; H01L 2933/025; H01L 2933/0041
See application file for complete search history.

(56) References Cited

U.S. PATENT DOCUMENTS 8,183,587 B2 * 5/2012 Samuelson ............ B82Y 10/00
257/79
2005/0072981 A1    4/2005 Suenaga
(Continued)

FOREIGN PATENT DOCUMENTS

DE    10 2006 024 175 B3    9/2007
DE    10 2010 011 895 A1    9/2011
(Continued)

OTHER PUBLICATIONS

First Office Action dated Feb. 14, 2017, of corresponding Chinese Application No. 201480025863.2 in English.

*Primary Examiner* — Fernando L Toledo
*Assistant Examiner* — Neil Prasad
(74) *Attorney, Agent, or Firm* — DLA Piper LLP (US)

(57) ABSTRACT

A method of producing an optoelectronic component includes providing a substrate with an optoelectronic semiconductor chip arranged on a surface of the substrate; providing a mask having a lower layer and an upper layer, wherein the lower layer has a lower opening and the upper layer has an upper opening, which openings jointly form a continuous mask opening, and the lower opening has a larger area than the upper opening; arranging the mask above the surface of the substrate such that the lower layer faces the surface of the substrate and the mask opening is arranged above the optoelectronic semiconductor chip; spraying a layer onto the optoelectronic semiconductor chip through the mask opening; and removing the mask.

15 Claims, 3 Drawing Sheets

(52) U.S. Cl.
CPC .. *H01L 2224/97* (2013.01); *H01L 2933/0025* (2013.01); *H01L 2933/0041* (2013.01)

(56) References Cited

U.S. PATENT DOCUMENTS

| | | |
|---|---|---|
| 2006/0170332 A1 | 8/2006 | Tamaki et al. |
| 2010/0237775 A1 | 9/2010 | Chao |
| 2011/0227198 A1 | 9/2011 | Wunderer et al. |
| 2012/0244652 A1 | 9/2012 | Chen et al. |
| 2013/0140591 A1 | 6/2013 | Tseng et al. |
| 2013/0164868 A1 | 6/2013 | Chen et al. |
| 2013/0285086 A1* | 10/2013 | Hu .................. H01L 27/156 257/98 |
| 2015/0311403 A1* | 10/2015 | Katoh .............. H01L 33/486 257/98 |
| 2015/0338643 A1* | 11/2015 | Erlich .............. G02B 26/085 438/458 |

FOREIGN PATENT DOCUMENTS

| | | |
|---|---|---|
| EP | 1 605 028 A1 | 12/2005 |
| EP | 2 230 700 A2 | 9/2010 |
| JP | 2003-318448 A | 11/2003 |
| JP | 2009-64727 | 3/2009 |
| JP | 2013-138132 A | 7/2013 |
| KR | 10-2011-0024034 A | 3/2011 |
| KR | 10-2011-0109425 | 10/2011 |

\* cited by examiner

METHOD OF PRODUCING AN OPTOELECTRONIC COMPONENT

TECHNICAL FIELD

This disclosure relates to a method of producing an optoelectronic component.

This application claims priority of DE 10 2013 208 223.1, the content of which is hereby incorporated by reference.

BACKGROUND

It is known to equip optoelectronic components comprising optoelectronic semiconductor chips with conversion elements that convert a wavelength of electromagnetic radiation emitted by the optoelectronic semiconductor chip. As a result, by way of example, white light can be generated from the light of optoelectronic semiconductor chips which emit in the blue spectral range.

Various methods are known for producing conversion elements and equipping optoelectronic components with conversion elements. One cost-effective and efficient method consists of spray coating optoelectronic semiconductor chips with a conversion layer. In that case, a material comprising a wavelength-converting phosphor is sprayed onto the light-emitting side of the optoelectronic semiconductor chip. In that case, however, part of the material comprising the wavelength-converting phosphor also deposits alongside the optoelectronic semiconductor chip. That results in an inhomogeneous emission characteristic in optoelectronic semiconductor chips embodied as surface emitters.

It could therefore be helpful to provide a method of producing an optoelectronic component.

SUMMARY

I provide a method of producing an optoelectronic component including providing a substrate with an optoelectronic semiconductor chip arranged on a surface of the substrate; providing a mask having a lower layer and an upper layer, wherein the lower layer has a lower opening and the upper layer has an upper opening, which openings jointly form a continuous mask opening, and the lower opening has a larger area than the upper opening; arranging the mask above the surface of the substrate such that the lower layer faces the surface of the substrate and the mask opening is arranged above the optoelectronic semiconductor chip; spraying a layer onto the optoelectronic semiconductor chip through the mask opening; and removing the mask.

I further provide a method of producing an optoelectronic component including providing a substrate with an optoelectronic semiconductor chip arranged on a surface of the substrate; providing a mask having a lower layer and an upper layer, wherein the lower layer has a lower opening and the upper layer has an upper opening, which openings jointly form a continuous mask opening, and the lower opening has a larger area than the upper opening; arranging the mask above the surface of the substrate such that the lower layer faces the surface of the substrate and the mask opening is arranged above the optoelectronic semiconductor chip, wherein the lower layer is brought into contact with the surface of the substrate; spraying a layer onto the optoelectronic semiconductor chip through the mask opening; and removing the mask.

BRIEF DESCRIPTION OF THE DRAWINGS

FIG. 4 shows a section through the substrate and the mask after a layer has been sprayed on.

LIST OF REFERENCE SIGNS

Figure 1:
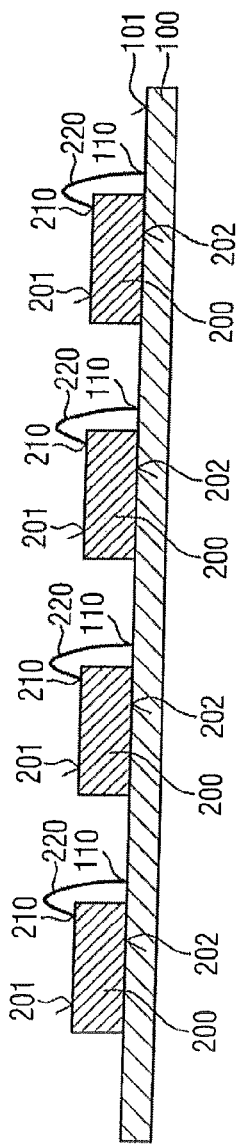
FIG. 1 shows a section through a substrate with a plurality of optoelectronic semiconductor chips.

10 Optoelectronic component
100 Substrate
101 Surface
110 Contact pad
120 Dividing plane
200 Optoelectronic semiconductor chip
201 Top side
202 Underside
210 Contact pad
220 Bond wire
300 Mask
301 Top side
302 Underside
310 Lower layer
315 Lower web
320 Lower opening
321 Lower opening face
330 Upper layer
335 Upper web
340 Upper opening
341 Upper opening face
350 Mask opening
400 Layer
401 Wavelength-converting phosphor
410 Part deposited on optoelectronic semiconductor chip
420 Part deposited alongside optoelectronic semiconductor chip
430 Part deposited on mask

DETAILED DESCRIPTION

My method of producing an optoelectronic component comprises steps of providing a substrate with an optoelectronic semiconductor chip arranged on a surface of the substrate, providing a mask having a lower layer and an upper layer, wherein the lower layer has a lower opening and the upper layer has an upper opening, which openings jointly form a continuous mask opening, wherein the lower opening has a larger area than the upper opening, arranging the mask above the surface of the substrate such that the lower layer faces the surface of the substrate and the mask opening is arranged above the optoelectronic semiconductor chip, spraying a layer onto the optoelectronic semiconductor chip through the mask opening, and removing the mask.

Advantageously, in this method, the sprayed-on layer is substantially restricted to a top side of the optoelectronic semiconductor chip. Only a small part of the sprayed-on layer deposits laterally alongside the optoelectronic semiconductor chip. As a result, the optoelectronic component obtainable according to this method can advantageously have a very homogeneous emission characteristic. Since the lower opening in the lower layer of the mask facing the surface of the substrate and the optoelectronic semiconductor chip has a larger opening area than the upper opening in the upper layer of the mask, during the process of arranging the mask above the surface of the substrate there is advantageously only a reduced risk of damaging the optoelectronic semiconductor chip. The upper opening having a smaller opening area advantageously delimits the region of the surface of the substrate in which the sprayed-on layer deposits. In this case, the size of the upper opening is advantageously chosen to be smaller than the size of the lower opening.

The upper opening may be a maximum of 10% larger than a top side of the optoelectronic semiconductor chip facing away from the substrate. In this method, the size of the region at the surface of the substrate in which the sprayed-on layer deposits is substantially defined by the size of the upper opening. In the fact that the upper opening is a maximum of 10% larger than the top side of the optoelectronic semiconductor chip facing away from the substrate advantageously ensures that the region at the surface of the substrate in which the sprayed-on layer deposits is also not significantly larger than the top side of the optoelectronic semiconductor chip. As a result, the sprayed-on layer advantageously substantially deposits at the top side of the optoelectronic semiconductor chip and at most to a small extent in a vicinity of the optoelectronic semiconductor chip.

The upper opening may be centered above the optoelectronic semiconductor chip in a direction perpendicular to the surface of the substrate. This advantageously ensures that the sprayed-on layer also deposits in a centered fashion above the optoelectronic semiconductor chip. As a result, the optoelectronic component obtainable according to the method can advantageously have a homogeneous emission characteristic.

The lower opening and/or the upper opening may be rectangular. Advantageously, the method is then particularly well suited to produce an optoelectronic component comprising a rectangular optoelectronic semiconductor chip.

The lower opening and the upper opening may be arranged coaxially. Advantageously, the lower layer of the mask facing the surface of the substrate can then be arranged above the surface of the substrate such that the lower layer of the mask is spaced apart at the same distance from the optoelectronic semiconductor chip on all sides of the optoelectronic semiconductor chip.

Providing the substrate with the optoelectronic semiconductor chip arranged on the surface may comprise a step of arranging a bond wire between the optoelectronic semiconductor chip and a contact pad arranged on the surface of the substrate. Advantageously, the optoelectronic semiconductor chip of the optoelectronic component obtainable according to the method can then be electrically contacted via the contact pad arranged on the surface of the substrate.

The bond wire may be at least partly covered by the upper layer of the mask in a direction perpendicular to the surface of the substrate. Advantageously, this at least partly prevents the bond wire from being embedded into the sprayed-on layer.

The lower layer of the mask may be brought into contact with the surface of the substrate in the process of arranging the mask above the surface of the substrate. Advantageously, the surface of the substrate outside the intended region is thereby protected particularly effectively against covering with the sprayed-on layer. Owing to the lower opening having a larger opening area in the lower layer of the mask, in the procedure according to the method there is nevertheless only a reduced risk of the optoelectronic semiconductor chip or a possible bond wire being damaged while the lower layer of the mask is brought into contact with the surface of the substrate.

The lower layer and the upper layer of the mask may be continuously integral. As a result, handling of the mask is advantageously particularly simple. As a result, the mask can also be produced particularly simply and cost-effectively. By way of example, the mask can be produced by an electrolytic method.

The mask may comprise nickel. Advantageously, the mask is then simply and cost-effectively producible and is suitable for multiple use in successive repetitions of the method.

The sprayed-on layer may comprise a wavelength-converting phosphor. Advantageously, the sprayed-on layer then forms a converter element of the optoelectronic component, which can convert a wavelength of electromagnetic radiation emitted by the optoelectronic semiconductor chip. Since the sprayed-on layer in this method is substantially restricted to the top side of the optoelectronic semiconductor chip, the optoelectronic component obtainable according to the method can advantageously have a particularly homogeneous emission characteristic.

The substrate is provided with a plurality of optoelectronic semiconductor chips arranged on the surface. The mask is provided with a plurality of mask openings. In this case, a mask opening is arranged above each optoelectronic semiconductor chip. As a result, the method advantageously allows a parallel coating of the surfaces of all the optoelectronic semiconductor chips with the sprayed-on layer.

The optoelectronic semiconductor chips may be provided in a regular grid arrangement on the surface of the substrate. Advantageously, the mask can then also be a regular grid. As a result, alignment of the mask above the surface of the substrate is particularly simple. Moreover, as a result, in a subsequent method step, the substrate can be divided particularly simply to obtain a plurality of optoelectronic components.

The method may comprise a further step of dividing the substrate to obtain a plurality of optoelectronic components. As a result, the method advantageously enables parallel production of a plurality of optoelectronic components in joint work operations. The production costs per individual optoelectronic component can advantageously be reduced as a result.

The above-described properties, features and advantages and the way in which they are achieved will become clearer and more clearly understood in association with the following description of the examples which are explained in greater detail in association with the drawings.

FIG. 1 shows a schematic illustration of a substrate 100 and a plurality of optoelectronic semiconductor chips 200 during performance of a method of producing an optoelectronic component. The method has not yet finished in the situation illustrated in FIG. 1.

The substrate 100 is a substantially flat plate having a substantially planar surface 101. In a lateral direction, the surface 101 of the substrate 100 can have a circular disk shape or a rectangular shape, for example. The substrate 100 preferably consists of an electrically insulating material. The substrate 100 can comprise a ceramic material, for example.

The optoelectronic semiconductor chips 200 can be light-emitting diode chips (LED chips), for example. Preferably, the optoelectronic semiconductor chips 200 are all identical or similar. Each optoelectronic semiconductor chip 200 has a top side 201 and an underside 202 opposite the top side 201. The undersides 202 of the optoelectronic semiconductor chips 200 face the surface 101 of the substrate 100. The top side 201 of each optoelectronic semiconductor chip 200 forms a radiation emission face. The optoelectronic semiconductor chips 200 emit electromagnetic radiation, for example, visible light during operation at the radiation emission face formed at the top side 201.

Each optoelectronic semiconductor chip 200 has an electrical contact pad 210 at its top side 201. The substrate 100 has at its surface 101 one contact pad 110 per optoelectronic semiconductor chip 200. The contact pads 110 at the surface 101 of the substrate 100 can, for example, be electrically conductively connected to through contacts running through the substrate 100. The contact pads 210 at the surfaces 201 of the optoelectronic semiconductor chips 200 electrically conductively connect to a respective contact pad 110 at the surface 101 of the substrate 100 by a respective bond wire 220.

The optoelectronic semiconductor chips 200 can have a respective further electrical contact pad at their underside 202. In this case, the electrical contact pad arranged at the underside 202 of each optoelectronic semiconductor chip 200 electrically conductively connects to a respective further electrical contact pad at the top side 101 of the substrate 100, for example, by a conductive adhesive or a solder. However, the optoelectronic semiconductor chips 200 can also each have a further electrical contact pad at their top side 201. In this case, the further electrical contact pad at the top side 201 of each optoelectronic semiconductor chip 200 can connect to a respective further contact pad at the surface 101 of the substrate 100 by a further bond wire. In this case, too, the optoelectronic semiconductor chips 200 can be fixed to the surface 101 of the substrate 100 by an adhesive or solder.

The optoelectronic semiconductor chips 200 are spaced apart from one another at the surface 101 of the substrate 100. Preferably, the optoelectronic semiconductor chips 200 are arranged in a regular two-dimensional grid arrangement at the surface 101 of the substrate 100. By way of example, the optoelectronic semiconductor chips 200 can form a rectangular grid at the surface 101 of the substrate 100.

Figure 2:
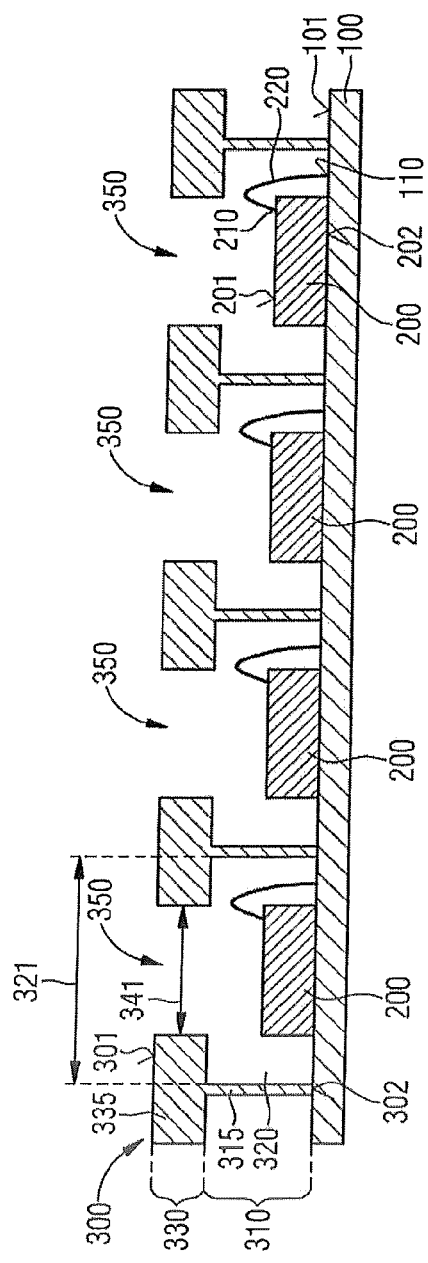
FIG. 2 shows a section through the substrate and a mask arranged above the optoelectronic semiconductor chips.
Figure 3:
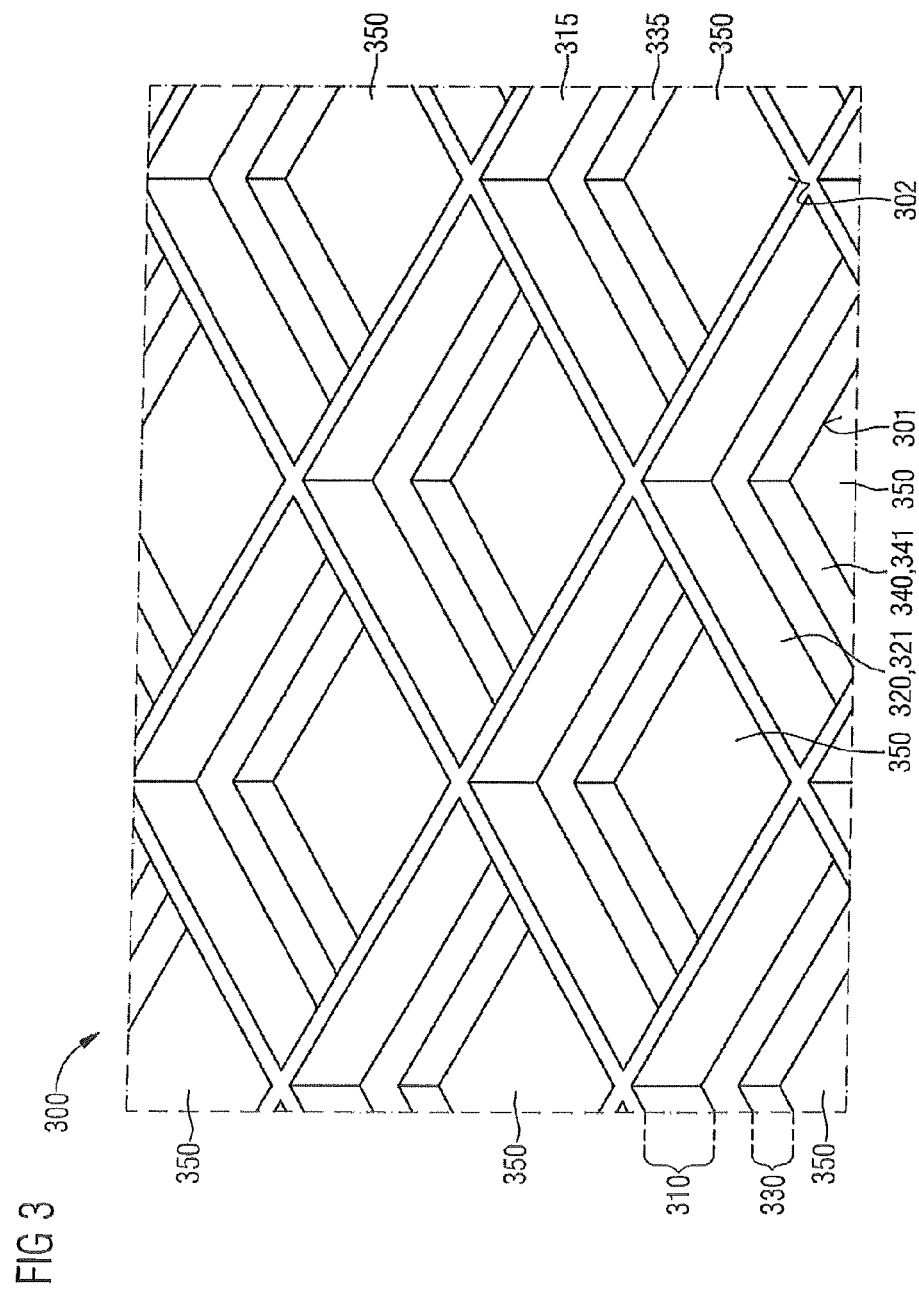
FIG. 3 shows a perspective view of the mask.

FIG. 2 shows a schematic sectional illustration of the substrate 100 with the optoelectronic semiconductor chips 200 arranged on the surface 101 of the substrate 100 in a processing state temporally succeeding the illustration in FIG. 1. A mask 300 was arranged at the surface 101 of the substrate 100. FIG. 3 shows a schematic perspective illustration of part of the mask 300.

The mask 300 is a flat grid and has a top side 301 and an underside 302 opposite the top side 301. The mask 300 is arranged at the surface 101 of the substrate 100 such that the underside 302 of the mask 300 faces the surface 101 of the substrate 100. In this case, the underside 302 of the mask 300 is preferably in contact with the surface 101 of the substrate 100.

The mask 300 can be produced by an electrolytic method, for example, and can comprise nickel, for example.

The mask 300 has a lower layer 310 and an upper layer 330. The lower layer 310 forms the underside 302 of the mask 300. The upper layer 330 forms the top side 301 of the mask 300. The lower layer 310 and the upper layer 330 adjoin one another. Preferably, the lower layer 310 and the upper layer 330 of the mask 300 are material-uniformly continuous.

The mask 300 has a plurality of mask openings 350 extending through the mask 300 perpendicularly between the top side 301 and the underside 302. Each mask opening 350 extends through the upper layer 330 and the lower layer 310 of the mask 300. In this case, each mask opening 300 is formed by an upper opening 340 arranged in the upper layer 330 and a lower opening 320 arranged in the lower layer 310.

The mask openings 350 of the mask 300 are arranged in a rectangular grid arrangement corresponding to the arrangement of the optoelectronic semiconductor chips 200 at the surface 101 of the substrate 100. In the example illustrated in FIGS. 2 and 3, the mask openings 350 are arranged in a rectangular grid.

The upper layer 330 of the mask 300 forms upper webs 335, which run between the upper openings 340 of the upper layer 330. The lower layer 310 of the mask 300 forms lower webs 315, which run between the lower openings 320 of the lower layer 310. In the example shown in FIGS. 2 and 3, both the upper openings 340 in the upper layer 330 of the mask 300 and the lower openings 320 in the lower layer 310 of the mask 300 are rectangular. At the same time, the mask openings 350 of the mask 300 formed by the upper openings 340 and the lower openings 320 are arranged in a rectangular grid. Consequently, the upper webs 335 and the lower webs 315 of the mask 300 form in each case bars running rectilinearly and intersecting at right angles.

Each upper opening 340 of the upper layer 330 of the mask 300 has an upper opening face 341. Each lower opening 320 in the lower layer 310 of the mask 300 has a lower opening face 321. The upper opening face 341 is smaller than the lower opening face 321. Consequently, the upper webs 335 of the upper layer 330 of the mask 300 are wider than the lower webs 315 of the lower layer 310. A respective circumferential shoulder is formed at the transition between the lower opening 320 and the upper opening 340 of each mask opening 350.

In the processing state illustrated in FIG. 2, the mask 300 is arranged at the surface 101 of the substrate 100 such that the underside 302 of the mask 300 formed by the lower layer 310 faces the surface 101 of the substrate 100 and is preferably in contact with the surface 101 of the substrate 100. In this case, the mask 300 is aligned with the optoelectronic semiconductor chips 200 arranged at the surface 101 of the substrate 100 such that a respective mask opening 350 of the mask 300 is arranged above the top side 201 of each optoelectronic semiconductor chip 200. Preferably, in this case the upper opening 340 of the respective mask opening 350 is centered above the top side 201 of the respective optoelectronic semiconductor chip 200. The size of the upper opening face 341 of the upper opening 340 of each mask opening 350 preferably approximately corresponds to the size of the top side 201 of the assigned optoelectronic semiconductor chip 200 and should generally be larger than the top side 201 of the assigned optoelectronic semiconductor chip 200 by not more than 10%.

The lower webs 315 of the lower layer 310 of the mask 300 run between the optoelectronic semiconductor chip 200 at the surface 101 of the substrate 100. If the upper openings 340 of the mask openings 350 are centered above the top sides 201 of the optoelectronic semiconductor chips 200 and the lower opening 320 and the upper opening 340 of each mask opening 350 of the mask 300 are arranged coaxially with respect to one another, then the lower webs 315 of the lower layer 310 of the mask 300 each run centrally between adjacent optoelectronic semiconductor chips 200. However, it is also possible for the lower webs 315 not to be arranged centrally between adjacent optoelectronic semiconductor chips 200, for example, to provide additional space for the bond wires 220.

The lower webs 315 of the lower layer 310 of the mask 300 are so narrow that, between the lower webs 315 arranged at the surface 101 of the substrate 100 and the optoelectronic semiconductor chips 200 and also the bond wires 220, there is a sufficient distance ensuring that the optoelectronic semiconductor chips 200 and the bond wires 200 are not damaged in the process of arranging the mask 300 at the surface 101 of the substrate 100.

The upper webs 335 of the upper layer 330 of the mask 300 have a width such that the upper webs 335 substantially completely cover the interspaces between the optoelectronic semiconductor chips 200. Preferably, the upper webs 335 also cover at least a portion of the bond wires 220.

In a direction perpendicular to the surface 101 of the substrate 100, the lower layer 310 with the lower webs 315 of the mask 300 is higher than the optoelectronic semiconductor chips 200 and a possible additional projection beyond the bond wires 220 is formed. As a result, the upper webs 335 are arranged above the top sides 201 of the optoelectronic semiconductor chips 200 and the bond wires 220 in a direction perpendicular to the surface 101 of the substrate 100.

Figure 4:
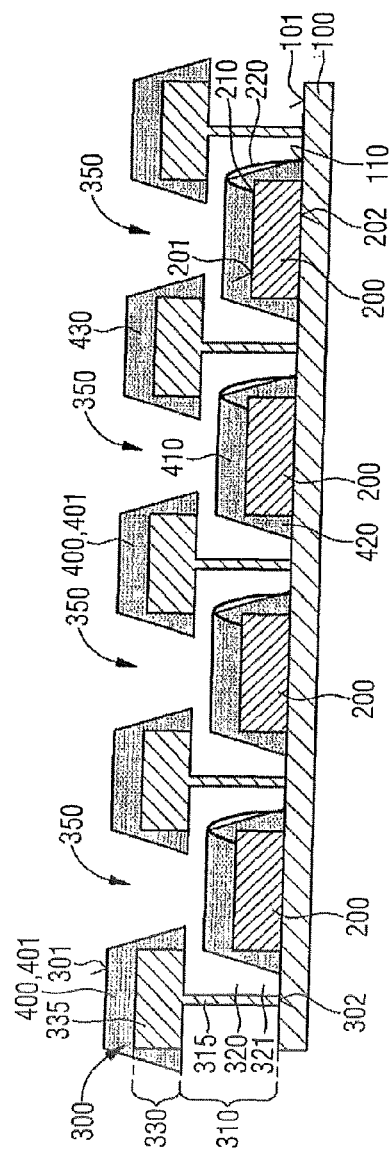

FIG. 4 shows a further schematic sectional illustration of the substrate 100 with the optoelectronic semiconductor chips 200 arranged at the surface 101 of the substrate 100 and with the mask 330 arranged thereabove in a processing state temporally succeeding the illustration in FIG. 2.

At the top sides 201 of the optoelectronic semiconductor chips 200, a layer 400 has been deposited by spraying. The layer 400 comprises a material comprising a wavelength-converting phosphor 401. The wavelength-converting phosphor 401 absorbs electromagnetic radiation having a wavelength from a first spectral range emitted by the optoelectronic semiconductor chips 200 and to emit electromagnetic radiation having a wavelength from a second spectral range, for example, electromagnetic radiation having a longer wavelength. The wavelength-converting phosphor 401 can be, for example, an organic phosphor or an inorganic phosphor. The wavelength-converting phosphor 410 can also comprise quantum dots.

The layer 400 was sprayed onto the top side 301 of the mask 300 and through the mask openings 350 onto the top sides 201 of the optoelectronic semiconductor chips 200 in a spraying direction oriented substantially perpendicularly to the surface 101 of the substrate 100. In this case, a part 401 of the layer 400 deposited at the top sides 201 of the optoelectronic semiconductor chips 200. A further part 430 of the layer 400 deposited at the top side 301 of the mask 300 on the upper webs 335 of the upper layer 330 of the mask 300. Since the interspaces between the optoelectronic semiconductor chips 200 are substantially covered by the upper webs 335 of the upper layer 330 of the mask 300 and owing to the substantially perpendicular spraying direction, alongside the optoelectronic semiconductor chips 200 in each case only a small part 420 of the layer 400 deposited at the side faces of the optoelectronic semiconductor chips 200 and the surface 101 of the substrate 100. The surface 101 of the substrate 100 between the optoelectronic semiconductor chips 200 was substantially not covered by the layer 400.

Figure 5:
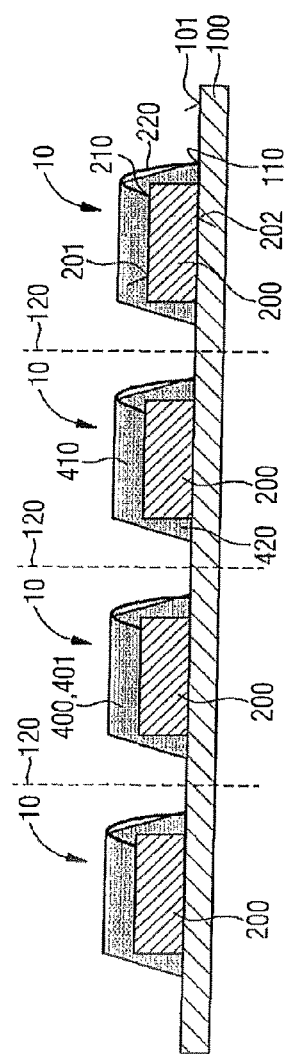
FIG. 5 shows a section through the substrate with the optoelectronic semiconductor chips and the sprayed-on layer after the mask has been removed.

FIG. 5 shows a further schematic sectional illustration of the substrate 100 with the optoelectronic semiconductor chips 200 arranged at the surface 101 and with the sprayed-on layer 400 in a processing state temporally succeeding the illustration in FIG. 4.

The mask 300 together with the part 430 of the sprayed-on layer 400 deposited on the mask 300 was lifted off from the surface 101 of the substrate 100 and removed. The part 430 of the layer 400 deposited on the mask 300 can subsequently be stripped away. The mask 300 can be reused in a repetition of the method explained with reference to FIGS. 1 to 5.

The parts 410, 420 of the layer 400 that remained at the top sides 201 of the optoelectronic semiconductor chips 200 and in the vicinity of the optoelectronic semiconductor chips 200 can be subjected to a curing process before or after the lift-off of the mask 300. The curing of the layer 400 can be carried out by a thermal method, for example. Depending on the exact material composition of the layer 400, however, curing of the layer 400 may also not be necessary.

In a processing step temporally succeeding the processing state illustrated in FIG. 5, the substrate 100 can be divided along dividing planes 120 running between the optoelectronic semiconductor chips 200 to obtain a plurality of optoelectronic components 10. Each of the obtainable optoelectronic components 10 comprises a part of the substrate 100 with one or a plurality of optoelectronic semiconductor chips 200 arranged thereon. If the optoelectronic semiconductor chips 200 are light-emitting diode chips, then the optoelectronic components 10 are light-emitting diode components.

My methods have been illustrated and described in more specific detail on the basis of the preferred examples. Nevertheless, this disclosure is not restricted to the examples disclosed. Rather, other variations can be derived therefrom by those skilled in the art, without departing from the scope of protection of the appended claims.

The invention claimed is:

1. A method of producing an optoelectronic component comprising:
   providing a substrate with an optoelectronic semiconductor chip arranged on a surface of the substrate;
   providing a mask having a lower layer and an upper layer, wherein the lower layer has a lower opening and the upper layer has an upper opening, which openings jointly form a continuous mask opening, and the lower opening has a larger area than the upper opening;
   subsequently arranging the provided mask above the surface of the substrate such that the lower layer faces the surface of the substrate and the mask opening is arranged above the optoelectronic semiconductor chip;
   spraying a layer onto the optoelectronic semiconductor chip through the mask opening; and
   removing the mask.

2. The method as claimed in claim 1, wherein the upper opening is a maximum of 10% larger than a top side of the optoelectronic semiconductor chip facing away from the substrate.

3. The method as claimed in claim 1, wherein the upper opening is centered above the optoelectronic semiconductor chip in a direction perpendicular to the surface of the substrate.

4. The method as claimed in claim 1, wherein the lower opening and/or the upper opening are/is rectangular.

5. The method as claimed in claim 1, wherein the lower opening and the upper opening are coaxially arranged.

6. The method as claimed in claim 1, wherein providing the substrate with the optoelectronic semiconductor chip arranged on the surface comprises arranging a bond wire between the optoelectronic semiconductor chip and a contact pad arranged on the surface of the substrate.

7. The method as claimed in claim 6, wherein the bond wire is at least partly covered by the upper layer of the mask in a direction perpendicular to the surface of the substrate.

8. The method as claimed in claim 1, wherein the lower layer is brought into contact with the surface of the substrate in the process of arranging the mask above the surface of the substrate.

9. The method as claimed in claim 1, wherein the lower layer and the upper layer are continuously integral.

10. The method as claimed in claim 1, wherein the mask comprises nickel.

11. The method as claimed in claim 1, wherein the sprayed-on layer comprises a wavelength-converting phosphor.

12. The method as claimed in claim 1, wherein:
the substrate is provided with a plurality of optoelectronic semiconductor chips arranged on the surface,
the mask has a plurality of mask openings, and
a mask opening is arranged above each optoelectronic semiconductor chip.

13. The method as claimed in claim 12, wherein the optoelectronic semiconductor chips are provided in a regular grid arrangement on the surface of the substrate.

14. The method as claimed in claim 12, further comprising dividing the substrate to obtain a plurality of optoelectronic components.

15. A method of producing an optoelectronic component comprising:

providing a substrate with an optoelectronic semiconductor chip arranged on a surface of the substrate;

providing a mask having a lower layer and an upper layer, wherein the lower layer has a lower opening and the upper layer has an upper opening, which openings jointly form a continuous mask opening, and the lower opening has a larger area than the upper opening;

subsequently arranging the provided mask above the surface of the substrate such that the lower layer faces the surface of the substrate and the mask opening is arranged above the optoelectronic semiconductor chip, wherein the lower layer is brought into contact with the surface of the substrate;

spraying a layer onto the optoelectronic semiconductor chip through the mask opening; and removing the mask.

\* \* \* \* \*